(12) United States Patent
Swerts et al.

(10) Patent No.: US 10,050,192 B2
(45) Date of Patent: Aug. 14, 2018

(54) MAGNETIC MEMORY DEVICE HAVING BUFFER LAYER

(71) Applicant: IMEC VZW, Leuven (BE)

(72) Inventors: Johan Swerts, Kessel-Lo (BE);
Kiroubanand Sankaran, Herent (BE);
Tsann Lin, Leuven (BE); Geoffrey Pourtois, Villers-la-Ville (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/373,342

(22) Filed: Dec. 8, 2016

(65) Prior Publication Data
US 2017/0170390 A1 Jun. 15, 2017

(30) Foreign Application Priority Data
Dec. 11, 2015 (EP) .................................... 15199646

(51) Int. Cl.
*H01L 43/08* (2006.01)
*H01L 27/22* (2006.01)
(Continued)

(52) U.S. Cl.
CPC .............. *H01L 43/08* (2013.01); *H01L 43/10* (2013.01); *H01L 43/12* (2013.01); *G11C 11/161* (2013.01);
(Continued)

(58) Field of Classification Search
CPC ..... H01L 43/08; H01L 27/222; G11C 11/161; G11C 2211/5615
See application file for complete search history.

(56) References Cited

U.S. PATENT DOCUMENTS 6,340,533 B1 1/2002 Ueno et al.
7,033,685 B2 4/2006 Lee et al.
(Continued)

FOREIGN PATENT DOCUMENTS

CN 101409135 B 12/2011
EP 1 435 091 B1 7/2014

OTHER PUBLICATIONS

Chou, C.Y., et al., "Microstructure and Magnetoresistance of MgO Thin Film with CoFeB and CoFeC Underlayers", *Journal of Magnetism and Magnetic Materials*, vol. 310, 2007, pp. 2245-2247.
(Continued)

*Primary Examiner* — Ida M Soward
(74) *Attorney, Agent, or Firm* — Knobbe, Martens, Olson & Bear LLP (57) ABSTRACT

The disclosed technology generally relates to magnetic memory devices, and more particularly to spin transfer torque magnetic random access memory (STT-MRAM) devices having a magnetic tunnel junction (MTJ), and further relates to methods of fabricating the STT-MRAM devices. In an aspect, a magnetoresistive random access memory (MRAM) device has a magnetic tunnel junction (MTJ). The MTJ includes a magnetic reference layer including CoFeB, a magnetic free layer comprising CoFeB, and a barrier layer including MgO. The barrier layer is interposed between the magnetic reference layer and the magnetic free layer. The barrier layer has a thickness adapted to tunnel electrons between the magnetic reference layer and the magnetic free layer sufficient to cause a change in the magnetization direction of the variable magnetization under a bias. The MTJ further comprises a buffer layer comprising one or more of Co, Fe, CoFe and CoFeB, where the buffer layer is doped with one or both of C and N.

16 Claims, 4 Drawing Sheets

(51) Int. Cl.
 *G11C 11/16* (2006.01)
 *H01L 43/10* (2006.01)
 *H01L 43/12* (2006.01)
(52) U.S. Cl.
 CPC ..... *G11C 2211/5615* (2013.01); *H01L 27/222* (2013.01)

(56) References Cited

U.S. PATENT DOCUMENTS

| | | | |
|---|---|---|---|
| 7,241,631 B2 | 7/2007 | Huai et al. | |
| 7,498,600 B2* | 3/2009 | Cho | H01L 45/12 257/2 |
| 7,502,208 B2 | 3/2009 | Hosomi | |
| 7,602,033 B2* | 10/2009 | Zhao | B82Y 10/00 257/427 |
| 7,969,692 B2 | 6/2011 | Takahashi | |
| 8,345,390 B2 | 1/2013 | Tsuchiya et al. | |
| 9,214,624 B2* | 12/2015 | Lee | H01L 43/12 |
| 9,287,323 B2* | 3/2016 | Guo | H01L 43/08 |
| 9,548,445 B2* | 1/2017 | Lee | H01L 43/12 |
| 9,705,076 B2* | 7/2017 | Nagamine | H01L 43/10 |
| 2008/0090106 A1 | 4/2008 | Braunstein et al. | |
| 2008/0112214 A1 | 5/2008 | Chung et al. | |
| 2014/0264673 A1* | 9/2014 | Kitagawa | H01L 43/10 257/421 |
| 2014/0367814 A1 | 12/2014 | Ohmori et al. | |
| 2015/0311432 A1* | 10/2015 | Nakagawa | H01L 43/08 438/3 |
| 2015/0318466 A1* | 11/2015 | Shimane | H01L 21/67109 438/765 |
| 2016/0005958 A1* | 1/2016 | Seino | H01L 43/08 438/3 |

OTHER PUBLICATIONS

Glannopoulos, G., et al., "High Anisotropy Induction into Multilayer Fe—Co Thin Films, Towards Rare Earth Free Permanent Magnets Appliciations", *IEEE Magnetics Conference* (INTERMAG), 2015, 2 pages.

Khan, I., et al., "Magnetic Anisotropy of C and N Doped Bulk FeCo Alloy: A First Principles Study", *Journal of Magnetism and Magnetic Materials*, vol. 388, 2015, pp. 101-105.

Kitamoto, Y., et al., "Microstructural Study of Nanocrystalline Soft Magnetic Thin Films of Fe—C and Fe—Co—C Deposited by Facing Targets Sputtering", *IEEE*, Department of Innovative and Engineered Materials, 2005, 1 page.

Wallisch, W., et al., "MS-12-P-2050 EMCD-Investigation of Co—Fe Thin Films Doped with Carbon by Analytical TEM", *Institute of Solid State Physics*, 2014, 2 pages.

Werwiński, M., et al., "Magnetocrystalline anisotropy calculations of $Fe_{13}Co.C$ SQS", *Department of Physics and Astronomy*, Uppsala University, Sweden, 2014, 1 page.

\* cited by examiner

MAGNETIC MEMORY DEVICE HAVING BUFFER LAYER

CROSS-REFERENCE TO RELATED APPLICATIONS

This application claims foreign priority to European Patent Application No. EP 15199646.9, filed Dec. 11, 2015, the content which is incorporated by reference herein in its entirety.

BACKGROUND

Field

The disclosed technology generally relates to magnetic memory devices, and more particularly to spin transfer torque magnetic random access memory (STT-MRAM) devices having a magnetic tunnel junction (MTJ) cell, and further relates to methods of fabricating the STT-MRAM devices.

Description of the Related Technology

Magnetic random access memory (MRAM) is emerging as an alternative to conventional semiconductor memories such as static random-access memory (SRAM), embedded SRAM, dynamic random access memory (DRAM) and/or flash memory. Compared to volatile memories such as SRAM and DRAM, MRAM can be advantageous because it can be designed to be non-volatile (e.g., data retention of >10 years). Compared to non-volatile memories such as flash memory used for storage application, MRAM can be advantageous because it can offer high endurance (e.g., greater than $10^6$ cycles of memory access).

As compared to field-switchable MRAM devices that were studied in the earlier part of the last decade, spin transfer torque magnetic random access memory, also referred to as spin-torque transfer magnetic random access memory (STT-MRAMs), have gained popularity more recently in part due to their potential to be scaled to very small sizes. It has been recognized that scalability of STT-MRAMs can be limited by thermal stability, as well as by writeability/rewriteability. Two different geometries, one with an in-plane magnetization direction and another one with an out-of-plane (perpendicular) magnetization direction, have been proposed. It has been suggested that, while the former may be implemented at entry level, the latter may be more promising to be implemented as a more scalable geometry of the two different geometries of magnetic tunnel junction (MTJ) cells, especially from switching and thermal stability perspectives.

SUMMARY OF CERTAIN INVENTIVE ASPECTS

An object of at least some of the embodiments of the present invention is to provide an MRAM device having a relatively high TMR and being relatively easy to manufacture.

At least one of this and other objects of the present invention is achieved by means of an MRAM device and a method having the features defined in the independent claims. Preferable embodiments of the invention are characterised by the dependent claims.

According to a first aspect of the present invention, an MRAM device is provided, having an MTJ formed of a stack of a magnetic reference layer and a magnetic free layer separated by a barrier layer. The magnetic reference layer and the magnetic free layer both comprise CoFeB, whereas the barrier layer comprises MgO. The reference layer is adapted to have a fixed magnetization direction, and the free layer is adapted to have a variable magnetization direction. The intermediate barrier layer is adapted to allow tunnelling of electrons between the reference layer and the free layer. The MRAM device further comprises a buffer layer comprising at least one of Co, Fe, CoFe and CoFeB and being doped or provided with at least one of C and N.

According to a second aspect of the present invention, a method of manufacturing an MRAM device according to the first aspect is provided. The method comprises forming a barrier layer, comprising MgO, on a magnetic reference layer comprising CoFeB, forming a magnetic free layer, comprising CoFeB, on the barrier layer, and forming a buffer layer comprising at least one of Co, Fe, CoFe and CoFeB and being doped with at least one of C and N.

When manufacturing an MTJ with a CoFeB/MgO/CoFeB stack, it is desirable to let the MgO crystallize before the CoFeB so as to allow the MgO to transfer its crystallographic 001 texture to the CoFeB. This can be achieved due to the presence of B, as diffusion of B may affect or determine the crystallization process of CoFe. Thus, by adding B to the CoFe, so as to form CoFeB, the crystallization of CoFe can be delayed enough to let the MgO crystallize first and hence transfer its texture to the CoFe during subsequent crystallization of the CoFe.

Adding a buffer layer to the MTJ is advantageous in that it may allow for the diffusion of B to be controlled. The buffer layer may e.g. impede or reduce diffusion of B, thereby delaying crystallization of the CoFe and hence allow for the texture of the MgO to be properly transferred to the CoFe. The ability to control diffusion of B hence allows for an improved crystalline quality and an MTJ having an improved TMR.

Alternatively, or additionally the buffer layer may be used for controlling other diffusion processes during manufacturing, anneal and/or use. The buffer layer may e.g. be used for reducing or impeding diffusion of electrode material, such as e.g. Ta, towards the MgO/CoFe interface. It is desirable to prevent or limit such diffusion, as it may result in a deteriorated or degraded MgO/CoFe interface and thus in a reduced TMR. Further, the buffer layer may prevent or reduce scavenging of O from MgO towards the electrode, thereby reducing the risk of MgO/CoFe interface deterioration or degradation.

The buffer layer, which also may be referred to as a diffusion buffer layer, hence allows for several diffusion processes to be controlled or at least impeded and thereby provides an MTJ having an increased thermal robustness. This is an advantage not at least from a manufacturing point of view, as a wider process window may be allowed during e.g. anneal.

A relatively thick CoFeB layer, such as 2-3 nm, may be used to reduce MgO/CoFeB interface degradation caused by diffusion of electrode material and/or scavenging of O towards the electrode. Reducing or controlling the diffusion processes in the CoFeB layer may hence allow for a thinner layer to be used, which is particularly advantageous for perpendicular MTJs which are known to show a rapid decrease in perpendicular magnetic anisotropy (PMA) for thicknesses above 1.0 nm. The present aspects allow for an MTJ having a thinner CoFeB layer and a higher thermal robustness.

Experiments have shown that controlling strain in the MTJ may provide an increased TMR and PMA. This may e.g. be achieved by inducing a vertical strain in CoFe, i.e. in a direction substantially perpendicular to the MgO/CoFe interface. The strain may be caused by C or N distorting the crystallographic structure in the MTJ, such as e.g. a tetragonal distortion of the cubic structure of the CoFe. The buffer layer may hence be referred to as a strain inducting layer. The increased PMA further allows for a thicker CoFe layer and hence an increased distance between the MgO and the electrode material. The increased distance may increase the thermal robustness of the MTJ, as the risk of electrode material diffusing towards the MgO may be reduced.

The C and/or N may be added as a dopant to the buffer layer in which it may occupy positions in the crystal structure that allow it to inhibit or block diffusion of e.g. B, O or Ta in the crystal structure, and in particular in the magnetic reference layer and/or the magnetic free layer. The buffer layer may be formed as a separate layer of a material comprising e.g. Co or Fe or a mixture of both, and may preferably have a thermal robustness that is similar to or higher than the thermal robustness of the remaining parts of the MTJ.

The reference layer, barrier layer, buffer layer and free layer may hence be arranged in a stack forming the MRAM device. The stack may comprise further, additional layers such as a seed layer, a cap layer, an electrode layer etcetera. Further, the reference layer, barrier layer, buffer layer and/or free layer may comprise a plurality of layers. In one example the reference layer may, in addition to a CoFeB layer, comprise a Co layer and a CoFeBTa layer. The free layer may, in addition to the CoFeB layer and the buffer layer, comprise a Mg/Ta layer and a further CoFeB layer.

It will be appreciated that the embodiments according to the present invention may refer to stacked structures wherein the reference layer is arranged at the bottom of the stack, i.e., below the barrier layer (also referred to as a bottom-pinned MTJ), or structures wherein the order of the reference layer and the free layer is reversed such that the free layer is arranged below the barrier layer and the reference layer above (also referred to as a top-pinned MTJ).

The position of the buffer layer in the MTJ may be selected based on the desired effect, such as increased TMR or increased PMA.

According to some embodiments, the buffer layer may be arranged in one or several of the following positions: in or adjacent to the magnetic reference layer, in or adjacent to the magnetic free layer, at the interface between the barrier layer and the magnetic reference layer, and the interface between the barrier layer and the magnetic reference layer. Further, the magnetic reference layer and/or the magnetic free layer may be formed of the buffer layer. In other words, buffer layer may together with the magnetic reference layer or the magnetic free layer form a common, or single layer having the combined properties of the buffer layer and the magnetic reference/free layer. Such a layer may e.g. be realised by doping the CoFeB of the reference layer or free layer with C or N.

According to an embodiment, the buffer layer may have a thickness in the range of 0.2 nm to 2 nm. The thickness may e.g. be determined by the dopant concentration, wherein relatively low concentration of C or N may be compensated by a relatively thick buffer layer and vice versa. A relatively thin buffer layer having a relatively high dopant concentration may lower the saturation magnetization of the doped FeCo, thus giving more room for additional CoFeB without reducing the PMA.

According to an embodiment, the buffer layer may comprise a concentration of C and/or N within the range of 1 to 8 atomic percent (at. %), and preferably within 1 and 4 at. %. It is advantageous to use concentrations above 1 at. % so as to achieve the desired diffusion blocking effect and/or strain inducing effect, and concentrations below 8 at. % so as to not hinder a BCC crystallization of the CoFe. These concentrations of C and/or N can be critical in combination with various other structural parameters described throughout the specification, as evident in the description below with respect to experimental results illustrated in FIGS. 4-6.

According to an embodiment, the MRAM device is a spin-transfer torque (STT) MRAM device utilising spin-aligned electrons to directly torque the magnetic domains of the free layer. The STT-MRAM device advantageously allows for a reduction of write currents.

According to an embodiment, the magnetic reference layer and the magnetic free layer has a perpendicular magnetic anisotropy allowing for the size of the MTJ to be reduced and for MRAM devices having an increased memory density.

According to an embodiment, the MRAM device is provided by forming an MgO barrier layer on the CoFeB of the magnetic reference layer. Subsequently, a C or N doped buffer layer comprising e.g. CoFeB or CoFeC may be provided on the MgO so as to structurally separate the barrier layer from the CoFeB of the magnetic free layer. The MTJ may then be annealed so as to allow the barrier layer to crystallize into a BCC texture and transfer the BCC texture to the magnetic reference layer and/or the magnetic free layer.

It will be appreciated that other embodiments than those described above are also possible. It will also be appreciated that any of the features in the embodiments described for the MRAM device according to the first aspect of the present invention may be combined with the manufacturing method according to the second aspect. Further objectives, or features of, and advantages with the present invention will become apparent when studying the following detailed disclosure, the drawings and the appended claims. Those skilled in the art will realise that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

DETAILED DESCRIPTION OF CERTAIN ILLUSTRATIVE EMBODIMENTS

The disclosed technology will now be described more fully hereinafter with reference to the accompanying drawings, in which exemplifying embodiments of the disclosed technology are shown. The disclosed technology may, however, be embodied in many different forms and should not be construed as limited to the embodiments set forth herein; rather, these embodiments are provided by way of example so that this disclosure will convey the scope of the invention to those skilled in the art. Furthermore, like numbers refer to the same or similar elements or components throughout.

As discussed above, MRAM is emerging as an alternative to many conventional semiconductor memories. There is a particularly growing interest in configuring STT-MRAMs as replacements for embedded static random-access memories (SRAMs), where non-volatile storage of data is enabled in part by magnetic tunnel junctions (MTJs). An MTJ comprises a magnetic reference layer, or pinned layer, and a magnetic free layer separated by a dielectric barrier layer, wherein the relative magnetic orientation of the reference layer and the free layer determines an electric resistance of the MTJ. The MTJ has a relatively low resistance when the magnetization of the reference layer and the free layer are aligned in parallel, while having a relatively high resistance when the magnetization of the reference layer and the free layer, respectively, are anti-parallel.

As described herein, tunnel magneto-resistance ratio (TMR) is a measure of the difference in electric resistance of the anti-parallel state and the parallel state. The TMR ratio is determined, inter alia, by the crystallographic texture of the MTJ, which in turn depends on e.g. annealing temperatures and diffusion processes within the MTJ.

According to various embodiments, the MTJ may have a free layer and/or the reference layer that may be formed of a ferromagnetic material such as Fe, Co, Ni and their alloys like but not limited to CoFe, NiFe, CoFeNi, CoFeB, CoZrTa, CoZrNr, FeN, CoFeN, and CoFeAl, among other ferromagnetic materials.

According to various embodiments, the MTJ includes a barrier layer, which can be a tunneling layer, formed between the free layer and the reference layer and comprising a dielectric material, e.g., MgO, $Al_2O_3$, $SiO_2$, $TiO_2$, $Ta_2O_5$ and $HfO_2$, among others.

In some embodiments of MTJs, the reference layer and the free layer comprise CoFe and the barrier layer MgO. Further, B may be added to the CoFe so as to delay the crystallization of CoFe and thereby allow MgO to crystallize first and transfer its 001 texture to the CoFe.

Although MTJs based on CoFe/MgO junctions may provide a relatively high TMR, there is still a need for MRAM devices having an increased TMR and while being relatively easy to fabricate.

Figure 1:
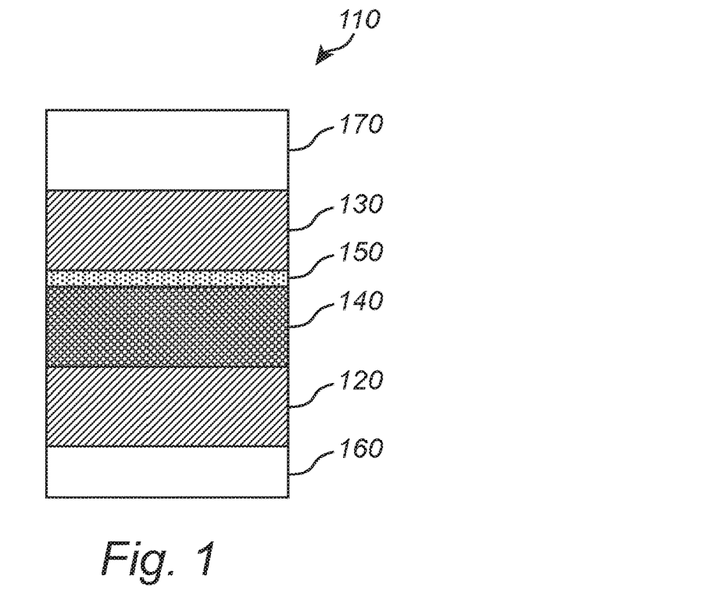
FIG. 1 schematically illustrates a magnetic tunnel junction (MTJ) of an MRAM device according to some embodiments.

With reference to FIG. 1, there is shown an MTJ 110 of an MRAM device according to an embodiment of the disclosed technology. The MTJ 110 may comprise of a stack of multiple layers, having e.g. a seed layer 160 in the bottom, and then layers in the following order: a magnetic reference or pinned layer 120, a barrier layer 140, a buffer layer 150, a magnetic free layer 130 and a cap layer 170. It should be noted the position of the buffer layer 150 is merely an example of one of several possible positions in the stack. Further, the order of the magnetic reference layer 120 and the free layer 130 may be reversed such that the magnetic reference layer 120 is arranged above the magnetic free layer 130. The magnetic reference layer 120 and the magnetic free layer 130 may have a perpendicular magnetic anisotropy with a direction that can be altered between e.g. two mutually opposing direction in the magnetic free layer 130. As described herein, a perpendicular magnetic anisotropy refers to a magnetic anisotropy direction being perpendicular to the plane of the magnetic layers.

The reference layer 120 and the free layer 130 may each be formed of, or at least comprise, CoFe or CoFeB. The CoFeB may e.g. be arranged in one or several layers in the reference layer 120 and/or the free layer. The barrier layer 140 may be formed of, or at least comprise, MgO configured to allow electrons to tunnel between the reference layer 120 and the free layer 130. According to various embodiments, the barrier layer 140 has a thickness adapted to tunnel electrons, e.g., quantum mechanically directly tunnel, between the magnetic reference layer 120 and the magnetic free layer 130 at a current density sufficient to cause a change in the magnetization direction of the variable magnetization under a bias, e.g., a write bias. For example, the thickness may be between about 2 nm and about 0.5 nm, between about 1.5 nm and about 0.5 nm, or between about 1.0 nm and about 0.5 nm. The write bias may be, e.g., between about 0.1V and 3V, between about 0.3V and 2V, between about 0.5V and 1.5V or between about 0.5V and 1V. The current density sufficient to cause the change in the magnetization direction may be, e.g., greater than $1\times10^5/cm^2$, greater than $5\times10^5/cm^2$ or greater than $1\times10^6/cm^2$. It will be appreciated that the current density is at least partially spin-polarized or spin-filtered due to the presence of the batter layer 140 comprising MgO.

The buffer layer 150 may, as already mentioned, be provided as an integral part of the magnetic free layer 130 or at the interface between the magnetic free layer 130 and the barrier layer 140. The buffer layer 150 may be formed of CoFe and a dopant such as e.g. C or N at a concentration that may be less than 8 at. %, such as e.g., less than 4 at. %. Without being bound to any theory, advantageous effects of adding the dopant may originate from a vertical strain that is induced in the buffer layer and/or from diffusion of atoms, e.g., B, being impeded or blocked through the buffer layer 150. Without being bound to any theory, the vertical strain may be compressive strain which may be caused, e.g., by volumetric expansion of the dopant atoms. The vertical strain may in turn increase the perpendicular magnetic anisotropy and/or result in an increased tunnel-magneto resistance ratio (TMR) of the MTJ. Impeding or controlling the diffusion of atoms, e.g., B, may desirably delay the crystallization of the CoFe or CoFeB (as compared to the crystallization of the MgO), e.g., during anneal and further reduce the risk of degradation of the interface between CoFe or CoFeB and MgO.

Figure 2:
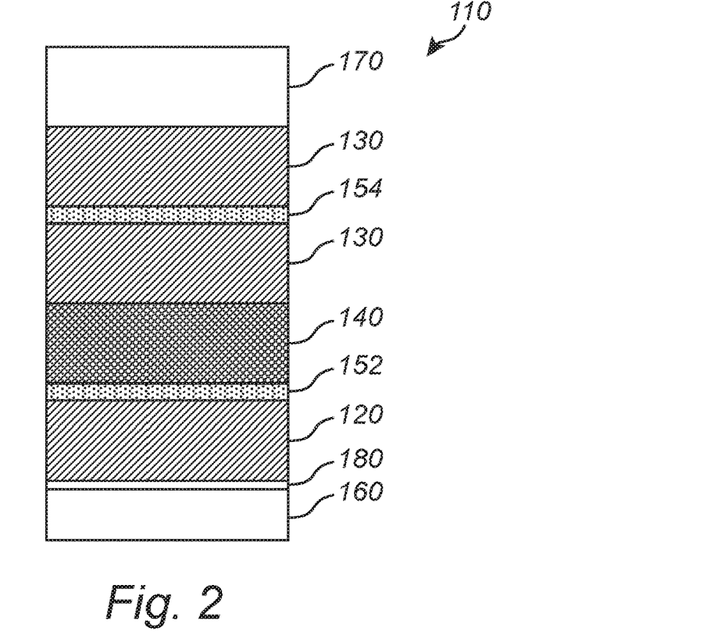
FIG. 2 schematically illustrates a magnetic tunnel junction (MTJ) of an MRAM device according to some other embodiments.

In FIG. 2, an MTJ 110 is shown that may be similarly configured as the MTJ described with reference to FIG. 1, according to other embodiments. Unlike FIG. 1, as shown in FIG. 2, a first buffer layer 152 may be formed as an integral part of the reference layer 120 or arranged at the interface between the reference layer 120 and the barrier layer 140. Alternatively, or additionally, a second buffer layer 154 may be arranged as an integral part of the free layer 130 or arrange at the interface between the free layer 130 and the barrier layer 140. Further, an electrode 180 is shown that may be arranged between the reference layer 120 and the underlying seed layer 160.

It will be appreciated that when formed as an integral part of the free layer 130 and/or the reference layer 120, the buffer layer 150 (FIG. 1) or buffer layers 152, 154 (FIG. 2) may form a region or regions having locally different composition(s) without forming a distinct interface between the buffer layer and the respective layer having the buffer layer as part thereof.

Figure 4:
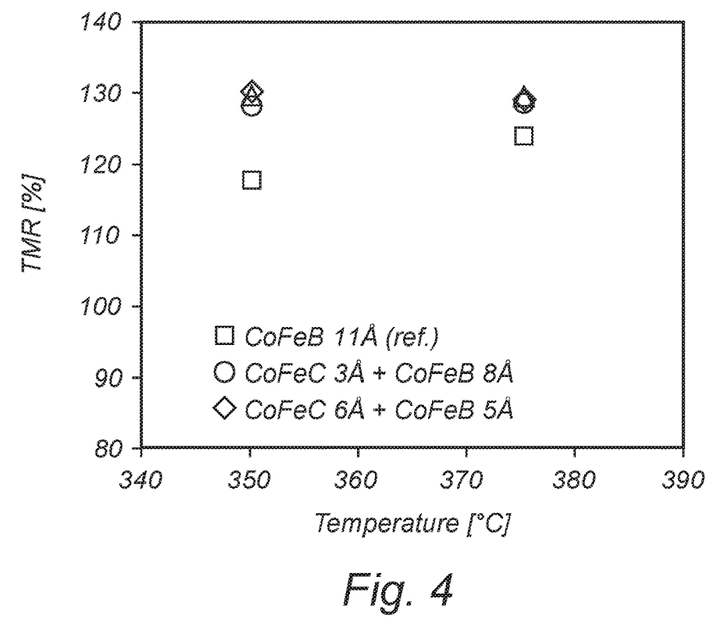
FIG. 4 is a graph illustrating measurements of tunnel magneto-resistance ratio (TMR) of MRAM devices having a buffer layer according to embodiments in comparison with a reference MRAM device not having a buffer layer.
Figure 5:
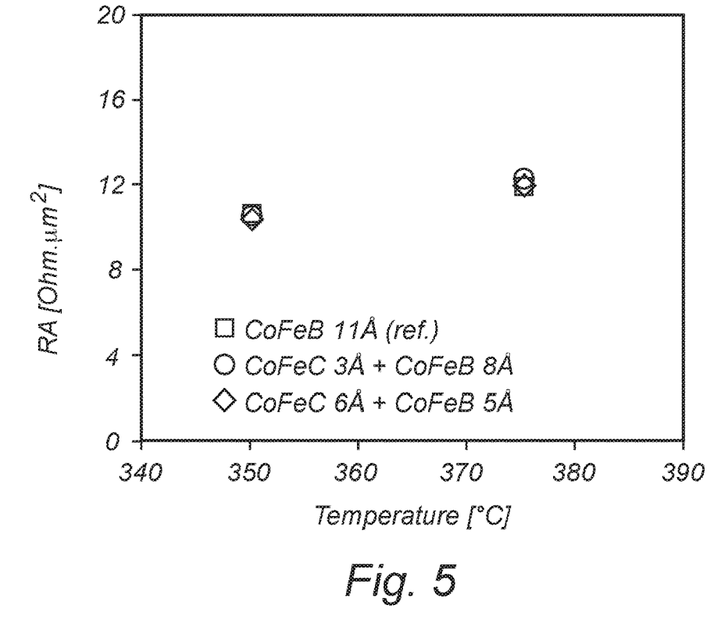
FIG. 5 is a graph illustrating measurements of the resistance-area product (RA) of the MRAM devices of FIG. 4.
Figure 6:
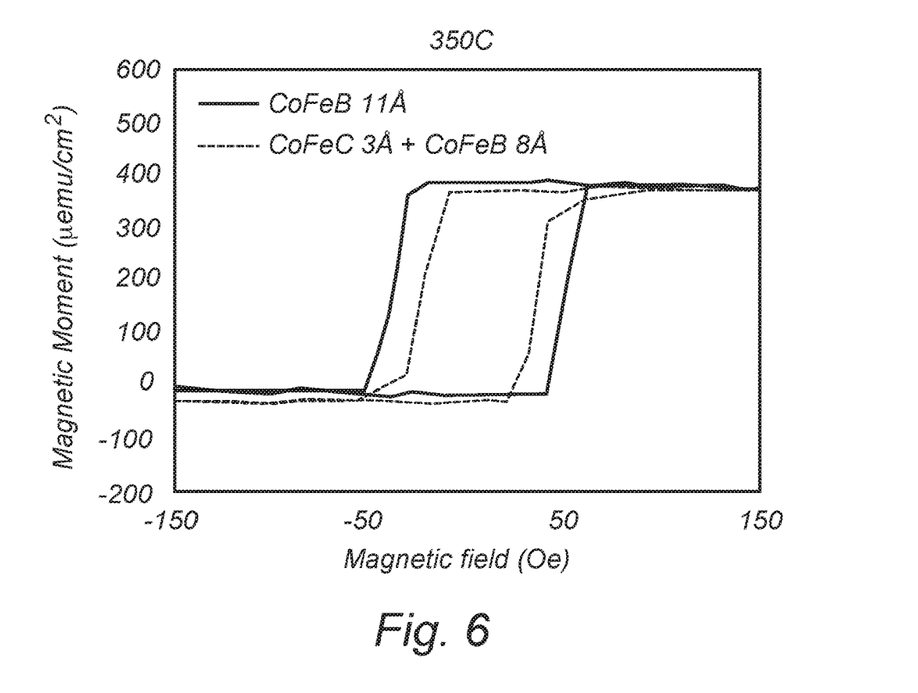
FIG. 6 is a graph illustrating measurements of the magnetic moment of the MRAM devices of FIGS. 4 and 5.

In various embodiments described herein, the buffer layer (150, FIG. 1; 152, 154 FIG. 2) may have an average thickness of 0.2 nm-2 nm, 0.2 nm-1.5 nm, or 0.2 nm-1.0 nm, for instance about 0.3 nm or about 0.5 nm (see the MRAM device measured for experimental results described with respect to FIGS. 4-6). In various embodiments, the ratio between thicknesses of the buffer layer and the adjacent layer (magnetic free layer 130, FIG. 1; magnetic free layer 130 and/or magnetic reference layer 120, FIG. 2) can be between about 0.1 and about 0.7, between about 0.2 and about 0.6, or between about 0.2 and about 0.5, for instance about 0.27 or about 0.46 nm (see the MRAM device measured for experimental results described with respect to FIGS. 4-6). These thicknesses and ratios can be critical in combination with various other structural parameters described throughout the specification, as evident in the description below with respect to experimental results illustrated in FIGS. 4-6.

As described herein, when the buffer layer 150, 152, 154 serves as a diffusion barrier or a diffusion buffer layer, the intermixing of elements between layers interposed by the buffer layer is suppressed, as indicated in the final device. The concentrations of elements in the magnetic free layer 130 are minimized to be substantially free thereof in the barrier layer 140, and the concentrations of elements in the barrier layer 140 are minimized to be substantially free thereof in the magnetic free layer 130. For example, B in the barrier layer 140 originating from the magnetic free layer 130 or the magnetic reference layer 120, or the O in the magnetic free layer 130 or the magnetic reference layer 120 originating from the barrier layer 140, may be substantially not present (e.g., less than 10%, less than 5%, less than 3% or less than 1%), after being subject to a temperature exceeding, e.g., 250° C. or 300° C., for instance 350° C. or 375° C. As a result, various device performance indicators are improved compared to devices that do not have the barrier layer 150, as described below with respect to experimental results illustrated in FIGS. 4-6.

Figure 3:
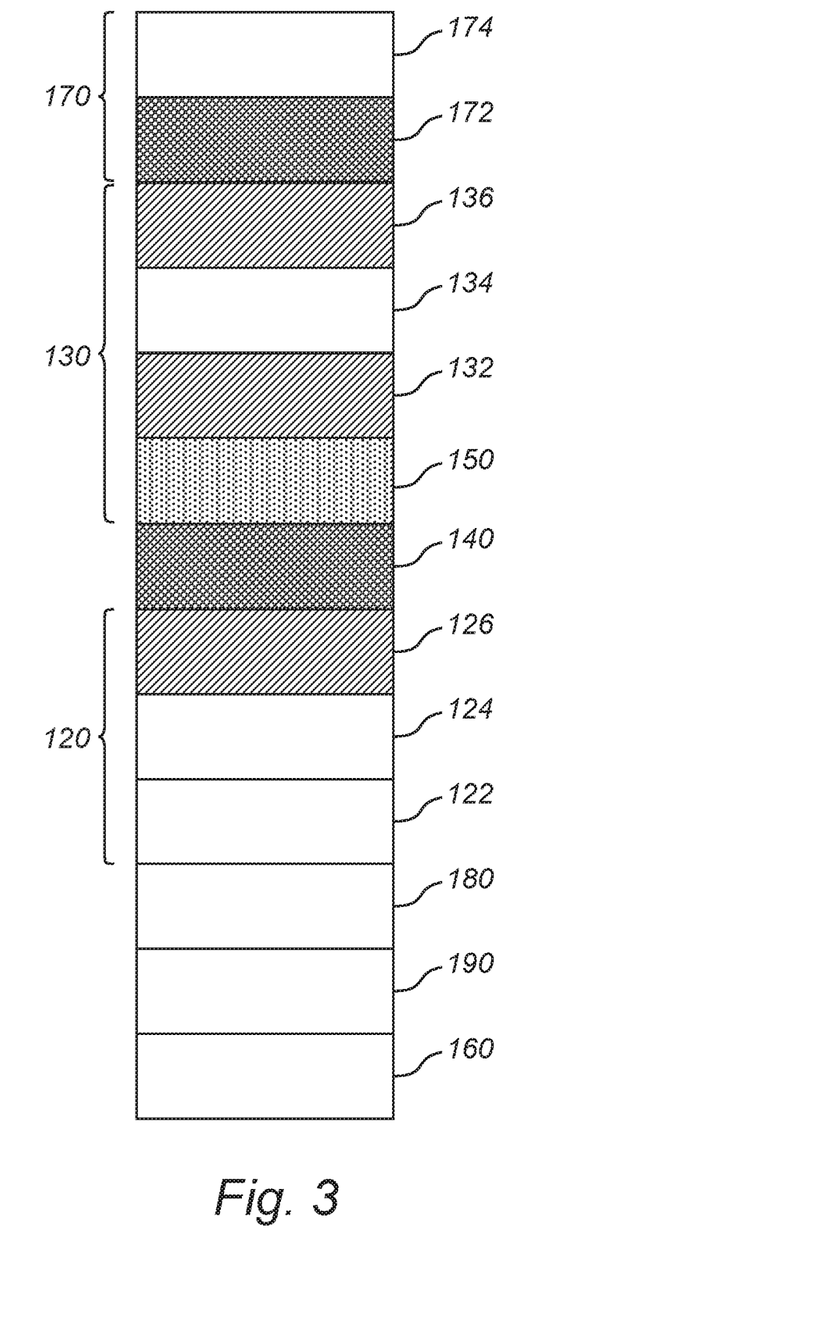
FIG. 3 schematically illustrates a magnetic tunnel junction (MTJ) of an MRAM device according to some other embodiments.

It will be appreciated that the free layer 130 and/or the reference layer 120 of the MRAM device may comprise a plurality of layers. As indicated in FIG. 3, which shows an embodiment that may be similarly configured as the embodiments shown in FIGS. 1 and 2, the reference layer 120 may be provided with e.g. a tri-layer design. The reference layer 120 may e.g. be formed of a stack of a Co layer 122, a CoFeBTa layer 124 and a CoFeB layer 126. The Co layer 122 may e.g. be provided on an electrode 180 that e.g. may comprise Ru, whereas the CoFeB layer 126 may be arranged closer, or adjacent, to the barrier layer 140.

Similarly, the free layer 130 may be formed of a stack of a buffer layer 150, e.g. comprising CoFeC, a CoFeB layer 132, a layer 134 comprising e.g. Mg and/or Ta, and a further CoFeB layer 136. As indicated in the example in FIG. 3, the buffer layer may be arranged on or adjacent to the barrier layer 140 whereas the further CoFeB layer 136 may be arranged on the top of the stack, adjacent to the cap layer 170. The cap layer may be formed of an additional MgO layer 172 and a metal cap layer 174.

The MRAM device as described above may further comprise a hard layer 190, which may comprise e.g. Co and/or Ni, and a seed layer 160 comprising e.g. Ni, Cr and/or Hf. The hard layer 190 may be arranged between the seed layer 160 and the electrode layer 180.

In the following, an experiment will be described which was performed to determine the performance of an MRAM device wherein a part of the CoFeB layer of the free layer was replaced by a buffer layer according to embodiments of the disclosed technology.

FIG. 4 is a diagram illustrating the results of an experiment wherein the TMR of three different MRAM devices was measured at 350° C. and 375° C. The third MRAM device is used as a reference device, having a free layer comprising an 11 Å thick layer of CoFeB. In the first and the second MRAM devices, a part of the 11 Å thick CoFeB layer has been replaced by a buffer layer of CoFeC according to embodiments of the disclosed technology (which may be similarly configured as the embodiments described with reference to FIGS. 1 to 3).

In the first MRAM device, the free layer comprises a 3 Å thick layer of CoFeC that is arranged on the barrier layer, and an 8 Å thick layer of CoFeB formed on the CoFeC layer. In the second MRAM device, the free layer has a twice as thick CoFeC layer as compared to the free layer of the first device, i.e., a 6 Å thick layer of CoFeC, onto which a 5 Å thick CoFeB layer is arranged.

As shown in the diagram in FIG. 4, no substantial difference in TMR was observed for the first and second MRAM device. The TMR was determined to be about 130% for both MRAM devices and for both 350° C. and 375° C. The third MRAM device, i.e., the reference MRAM device without any buffer layer, however showed a lower TMR at both temperatures. The TMR was determined to be just below 120% at 350° C. and about 125% at 375° C. The introduction of a buffer layer according to the disclosed technology hence allows for a higher TMR as compared to MRAM devices not having the buffer layer.

FIG. 5 is a diagram illustrating the results of measurements of the resistance-area product (RA) of the MRAM devices discussed with reference to FIG. 4. The RA is measured as at the same temperatures as above, i.e., at 350° C. and 375° C. As shown in FIG. 5, no substantial difference in RA is determined between any of the MRAM devices for a given temperature. Thus, by introducing the buffer layer according to embodiments of the invention to the free layer of the MTJ, the TMR may be increased without increasing the RA.

FIG. 6 is a diagram illustrating the results of measurements of the magnetic moment of the first MRAM device and the third MRAM device discussed with reference to FIG. 4. In the present study, the magnetic moment of the MRAM devices was studied as a function of an applied magnetic field. As indicated in the present Figure, no substantial difference in magnetic moment was observed for the first MRAM (having a buffer layer according to an embodiment of the invention) and the third MRAM device (having no buffer layer). Both MRAM devices in the study showed a switch from zero to about 350 micro emu/cm$^2$ at about +50 Oe, and back to zero at about −50 Oe. Thus, the introduction of the buffer layer according to embodiments of the disclosed technology to the free layer may provide for an increased TMR without substantially reducing the magnetic moment of the MRAM device.

Figure 7:
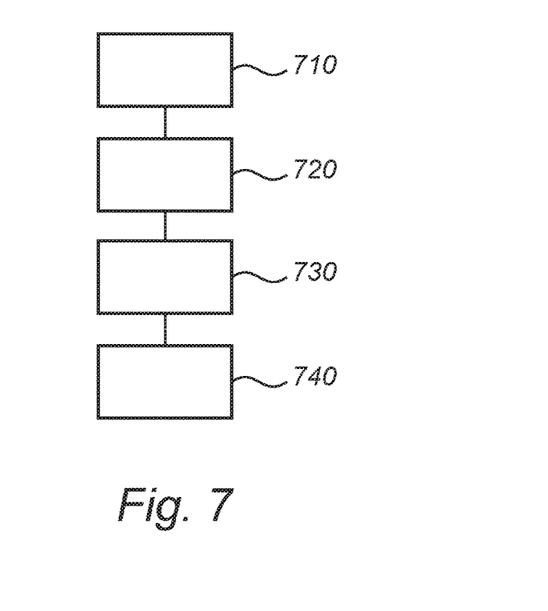
FIG. 7 is a flow chart illustrating a method of manufacturing an MRAM device according to embodiments.

FIG. 7 schematically depicts a method of manufacturing an MRAM device according to an embodiment of the present invention. The MRAM device may be similarly configured as the embodiments described with reference to FIGS. 1 to 6. In the method, a barrier layer comprising MgO may be formed 710 on a magnetic reference layer comprising CoFeB. Further, a magnetic free layer comprising CoFeB may be formed 720 on the barrier layer. Additionally, a buffer layer may be formed 730 which may comprise at least one of Co, Fe and CoFe and may be doped with C and/or N. The buffer layer may e.g. be formed between the barrier layer and the free layer. Further, the method may comprise a step of anneal 740 wherein the MTJ is subject to a temperature exceeding, e.g., 250° C. or 300° C., for instance 350° C. or 375° C., to allow one or more of the barrier layer, the magnetic reference layer and the magnetic free layer to crystallize, e.g., into a body-centered cubic (BCC) crystal structure.

In conclusion, an MRAM device is disclosed wherein a buffer layer of at least one of Co, Fe and CoFe, which is doped with C and/or N, is added to the stack forming the MTJ. The buffer layer may be used for controlling diffusion within layers of the stack so as to control the crystallization rate of the reference layer and/or the free layer and to reduce the risk of interface degradation at the interface between e.g. the reference/free layer and the barrier layer. Further, the buffer layer may be used for inducing strain in the MTJ stack and thereby increasing the PMA and/or TMR of the MTJ.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures or features are recited in mutually different dependent claims does not indicate that a combination of these measures or features cannot be used to advantage. Any reference signs in the claims should not be construed as limiting the scope.

What is claimed is:

1. A magnetoresistive random access memory (MRAM) device comprising a magnetic tunnel junction (MTJ), the MTJ comprising:
   a magnetic reference layer comprising CoFeB and having a fixed magnetization direction;
   a magnetic free layer comprising CoFeB and having a variable magnetization direction;
   a barrier layer comprising MgO, wherein the barrier layer is interposed between the magnetic reference layer and the magnetic free layer, and wherein the barrier layer has a thickness adapted to tunnel electrons between the magnetic reference layer and the magnetic free layer at a current density sufficient to cause a change in the magnetization direction of the magnetic free layer under a write bias; and
   one or more buffer layers formed at one or both sides of the barrier layer, wherein each of the one or more buffer layers comprises one or more of Co, Fe, CoFe and CoFeB and is doped with one or both of C and N.

2. The MRAM device according to claim 1, wherein the magnetic reference layer comprises a plurality of layers, and wherein one of the one or more buffer layers is one of the plurality of layers of the magnetic reference layer or a separate layer adjacent to the magnetic reference layer.

3. The MRAM device according to claim 2, wherein another one of the one or more buffer layers is one of the plurality of layers of the magnetic free layer or a separate layer adjacent to the magnetic reference layer.

4. The MRAM device according to claim 1, wherein the magnetic free layer comprises a plurality of layers, and wherein one of the one or more buffer layers is formed as one of the plurality of layers of the magnetic free layer or a separate layer adjacent to the magnetic free layer.

5. The MRAM device according to claim 4, wherein another one of the one or more buffer layers is one of the plurality of layers of the magnetic reference layer or a separate layer adjacent to the magnetic reference layer.

6. The MRAM device according to claim 1, wherein one of the one or more buffer layers is arranged adjacent to the barrier layer.

7. The MRAM device according to claim 1, wherein one of the one or more buffer layers is interposed between the barrier layer and the magnetic free layer.

8. The MRAM device according to claim 1, wherein at least one of the one or more buffer layers serves as part of one or both of the magnetic reference layer and the magnetic free layer.

9. The MRAM device according to claim 1, wherein at least one of the one or more buffer layers serve as a diffusion buffer layer between two layers contacting opposite sides of the at least one of the one or more buffer layers, such that each one of the contacting layers is substantially free of atomic elements of the other one of the contacting layers.

10. The MRAM device according to claim 9, wherein the diffusion buffer layer is adapted to impede diffusion therethrough of at least one of B and 0 in the magnetic reference layer and/or the magnetic free layer.

11. The MRAM device according to claim 1, wherein the buffer layer induces a strain in the MTJ.

12. The MRAM device according to claim 1, wherein the buffer layer has a thickness in the range of 0.2 nm-2 nm.

13. The MRAM device according to claim 1, wherein the buffer layer comprises a concentration of C or N within the range of 1 to 8 atomic percent.

14. The MRAM device according to claim 1, wherein the MRAM device is a spin-transfer torque MRAM (STT-MRAM).

15. The MRAM device according to claim 1, wherein the magnetic reference layer and the magnetic free layer has a direction of magnetic anisotropy that is perpendicular with respect to a major plane of one or both of the magnetic reference layer and the magnetic free layer.

16. The MRAM device according to claim 1, wherein the one or more buffer layers is doped with one or both of C and N at a concentration of 1 to 8 atomic percent.

* * * * *

UNITED STATES PATENT AND TRADEMARK OFFICE
CERTIFICATE OF CORRECTION

PATENT NO. : 10,050,192 B2
APPLICATION NO. : 15/373342
DATED : August 14, 2018
INVENTOR(S) : Johan Swerts Page 1 of 1

It is certified that error appears in the above-identified patent and that said Letters Patent is hereby corrected as shown below:

On the Title Page

Column 2, (Item 56), page 2, Line 8, under Other Publications, change "Glannopoulos," to --Giannopoulos,--.

Column 2, (Item 56), page 2, Line 23, under Other Publications, change "$Fe_{13}$ Co.C SQS"," to --$Fe_{13}Co_{19}C$ SQS",--.

In the Claims

Column 10, Line 40 (approx.), in Claim 10, change "0" to --O--.

Signed and Sealed this
Fifteenth Day of January, 2019

Andrei Iancu
*Director of the United States Patent and Trademark Office*